United States Patent [19]

Nishimura et al.

[11] Patent Number: 5,308,888
[45] Date of Patent: May 3, 1994

[54] FLUORINE-CONTAINING CURABLE RESIN COMPOSITION AND USE THEREOF

[75] Inventors: Shin Nishimura; Akira Nagai, both of Hitachi; Akio Takahashi, Hitachiota; Akio Mukoo, Mito; Tadashi Narita, Yokohama; Tokio Hagiwara; Hiroshi Hamana, both of Tokyo; Junichi Katagiri, Ibaraki, all of Japan

[73] Assignee: Hitachi, Ltd., Tokyo, Japan

[21] Appl. No.: 20,399

[22] Filed: Feb. 22, 1993

Related U.S. Application Data

[63] Continuation-in-part of Ser. No. 689,935, May 20, 1991.

[30] Foreign Application Priority Data

Sep. 20, 1989 [JP] Japan .................. 1-242034

[51] Int. Cl.$^5$ .................. C08J 3/28
[52] U.S. Cl. .................. 522/156; 525/326.3
[58] Field of Search .............. 522/156; 525/326.3; 526/238, 252

[56] References Cited

U.S. PATENT DOCUMENTS

| | | | |
|---|---|---|---|
| 3,933,773 | 1/1976 | Foerster | 204/159.2 |
| 4,129,617 | 12/1978 | Machi et al. | 204/159.17 |
| 4,188,354 | 2/1980 | Munari et al. | 264/22 |
| 4,294,908 | 10/1981 | Harita et al. | 430/286 |
| 4,394,489 | 7/1983 | Aufdermarsh | 525/326.3 |
| 4,931,279 | 6/1990 | Baua et al. | 525/326.3 |
| 5,104,911 | 4/1992 | Marchionni et al. | 522/187 |
| 5,159,026 | 10/1992 | Masatoshi | 525/326.3 |
| 5,219,904 | 6/1993 | Abe | 525/326.3 |

FOREIGN PATENT DOCUMENTS 90913873 2/1992 European Pat. Off. .

61-27853 6/1986 Japan .

OTHER PUBLICATIONS

Macromolecules, vol. 22, No. 7, Jul. 1989, pp. 3183-3184, T. Narita et al. "Anionic polymerization of fluorine-containing vinyl monomers. 9. Hexafluro-1, 3-butadiene".

Polymer Letters Edition, vol. 14, 1976, pp. 717-721, M. S. Toy et al., "NMR studies on microstructure of poly-perfluorobutadiene".

Primary Examiner—Joseph L. Schofer
Assistant Examiner—N. Sarafim
Attorney, Agent, or Firm—Antonelli, Terry, Stout & Kraus

[57] ABSTRACT

According to the present invention, there is provided a resin composition which can provide an insulating resin having excellent heat resistance and flame retardance after curing and showing a low dielectric constant.

A fluorine-containing photo-setting resin composition comprising a polymer containing fluorine or a fluorine-containing group represented by general formula [II]:

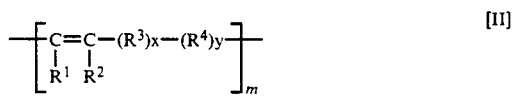

wherein $R^1$ and $R^2$ are selected from the group consisting of H, F, $CH_3$ and $CF_3$; $R^3$ and $R^4$ are selected from the group consisting of $CH_2$ and $CF_2$; x and y show 0 to 4 and m shows 30 to 1000, and a photopolymerization initiator, which is a solid at ambient temperature, melts between 100° and 150° C., has a melt viscosity of not greater than $10^6$ poise and is photocurable.

7 Claims, 3 Drawing Sheets

FLUORINE-CONTAINING CURABLE RESIN COMPOSITION AND USE THEREOF

The present invention is a continuation-in-part of U.S. application Ser. No. 07/689,935, filed on May 20, 1991 pending.

BACKGROUND OF THE INVENTION

1. Field of the Invention

The present invention relates to novel hexafluoro-1,3-butadiene prepolymer, curable materials using the same and laminates comprising the curable materials and more particularly, to materials for print circuit substrates having excellent heat resistance, moisture resistance and electric properties.

The present invention also relates to a fluorine-containing photo-curable resin composition, and varnish and prepreg using the resin composition as well as their use.

2. Statement of the Prior Art

For polymerization of hexafluoro-1,3-butadiene, radical polymerization and anion polymerization have been investigated. In the former radical polymerization, polymerizable composition occurs at random so that the polymerization product is a mixture of 1,2-polymer and 1,4-polymer (U.S. Pat. No. 3,663,521) (Journal of Polymer Science, Part B, 6, 639-642, 1968). The latter anion polymerization has been considered as an effective means for obtaining polymer having excellent steric regularity; however, it has been pointed out that when an alkyl lithium, Grignard reagent, an alkoxide or the like is used as a reaction initiator, the yield of polymer is as extremely poor as less than 1%.

For this reason, it is the actual situation that in spite of realizing a low water absorption and a low moisture vapor permeability thereby to expect improvement in moisture resistance, decrease in a dielectric constant, improvement in the surface quality, imparting heat resistance, etc., hexafluoro-1,3-butadiene polymer has not been applied to curable materials which are obtained by impregnating fibrous substrates including a glass prepreg, a glass mat, etc. with the polymer.

On the other hand, severe requirements for laminate materials used in multilayer circuit substrates for electron devices have been made to reduce their dielectric constant, from viewpoints of improving reliability on moistureproof and reliability on heat resistance and increasing computation speed of computers. As a means therefor, it has been investigated to apply fluorine materials (Japanese Patent Application Laid-Open No. 62-29454). The main trend of investigations on fluorine materials is toward thermoplastic saturated fluorocarbon materials but it has not been reported to apply thermosetting fluorine materials.

Thermoplastic saturated fluorine materials encounter many problems that material fluidity in laminate processing is poor, a thermal expansion coefficient is large due to a low glass transition point of molded products, dimensional stability in molded laminate products which is the key in achieving a minute circuit is inferior, wettability to fibrous substrates such as glass, Kevlar, etc. is poor to worsen impregnation property, it is difficult to improve mechanical strength, etc. It is thus difficult to apply thermoplastic fluorine materials to laminate materials.

As insulating materials having a specific dielectric constant of less than 3, there are hitherto known fluorine resins represented by polytetrafluoroethylene, tetrafluoroethylene-hexafluoropropylene copolymer, etc.; hydrocarbon resins such as polyethylene, polystyrene, polypropylene, etc. These insulating materials are generally used widely.

Fluorine resins are flame retardant as compared to hydrocarbon resins; however, as stated above fluorine resins are thermoplastic and inferior in mechanical property and dimensional stability at high temperature. To solve the problems, fluorine resins such as polytetrafluoroethylene as described above are incorporated into thermosetting resins which can form a crosslinking structure.

For example, there is known a method which comprises incorporating fluorine resin such as polytetrafluoroethylene, etc. into a resin composition comprising epoxy-modified polybutadiene, epoxy resin, carboxylic acid anhydride and a radical polymerization initiator, thereby to reduce a dielectric constant of insulating resin (Japanese Patent Application Laid-Open No. 2-72700).

Further in a process for preparing a laminate which comprises laminating resin boards obtained by impregnating a reinforcing material of the board with a fluorocarbon resin and adhering the boards, a 3-dimensionally crosslinked fluorocarbon resin layer is formed on the surface of the boards by plasma polymerization or sputtering, etc. so that an insulating material is improved in its mechanical property and dimensional stability at high temperature and the dielectric constant is reduced (Japanese Patent Application Laid-Open No. 2-106344).

However, even though saturated fluorine resin such as polytetrafluoroethylene, etc. is incorporated into conventional insulating resin such as epoxy resin or polybutadiene resin to attempt to reduce its dielectric constant, the insulating material has merely a poor affinity to fluorine resin. Furthermore, saturated fluorine resin such as polytetrafluoroethylene, etc. has a high melting point and is insoluble in a solvent; it is thus difficult to prepare varnish. Accordingly, an uneven portion is caused in the resin layer after curing. In addition, due to curing by heating, there are problems in dimensional accuracy and dimensional stability. For these reasons, mismatching tends to occur which makes it difficult to use these mixed resins as an insulating material for multilayered printing plate particularly requiring high density and high accuracy.

Further in the prior art methods by means of plasma polymerization or sputtering, resins are synthesized in the gaseous phase so that an efficiency of forming a resin layer is poor. To reach a desired thickness, a long period of time is required. In addition, crosslinking occurs at random since it is difficult to control the crosslinking reaction, and a thermal expansion coefficient is large due to free volume in the resin. Furthermore, high vacuum is required for plasma polymerization. Therefore, plasma polymerization or squttering results in poor productivity.

SUMMARY OF THE INVENTION

An object of the present invention is to provide novel hexafluoro-1,3-butadiene prepolymers obtained by the anion polymerization.

That is, the hexafluoro-1,3-butadiene prepolymer obtained in the present invention is represented by general formula:

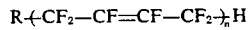    [I]

wherein R is fluorine or a residue of anionic polymerization initiator; and n is 4 to 6000, preferably 10 to 1000. In terms of its molecular weight, the hexafluoro-1,3-butadiene prepolymer is a thermosetting oligomer having a molecular weight in a range of about 700 to about 1,000,000. The prepolymer is excellent in fluidity of material in molding processing since the prepolymer is a thermosetting material with low viscosity.

The fluorine laminates provided by the present invention are characteristic of properties such as heat resistance, moisture resistance, a low dielectric constant, etc. and are applicable to high density multilayer substrates for computers. The fluorine laminates are extremely useful for achieving high efficiency and high speed computation of computers.

Based on the finding on a new process for anion polymerization of hexafluoro-1,3-butadiene, the object of the present invention has been achieved using thermosetting polymer of hexafluoro-1,3-butadiene which is a base for curable materials. The object of the present invention has been achieved further by providing compositions comprising the prepolymer, curable materials obtained by impregnating with the composition and drying, and laminates comprising the curable materials.

The present invention is thus directed to:

1. A hexafluoro-1,3-butadiene prepolymer represented by general formula [I]:

$$R + CF_2 - CF = CF - CF_2 +_n H \qquad [I]$$

wherein R is fluorine or a residue of anionic polymerization initiator; and n is 4 to 6000, preferably 10 to 1000.

2 A curable composition comprising the prepolymer and a polymerizable compound.

3. A curable material comprising the prepolymer or the composition having impregnated therewith a fibrous substrate.

Another object of the present invention is to provide a resin composition having excellent thermal resistance and excellent flame retardance after curing and also to provide an insulating material having a low dielectric constant comprising the resin composition, a varnish comprising the resin composition and a prepreg using the resin composition.

Thus, the present invention is directed to a fluorine-containing photo-setting resin composition comprising a polymer containing fluorine or a fluorine-containing group represented by general formula [II]:

$$\left[ \begin{array}{c} C=C-(R^3)x-(R^4)y \\ | \quad | \\ R^1 \quad R^2 \end{array} \right]_m \qquad [II]$$

wherein $R^1$ and $R^2$ are selected from the group consisting of H, F, $CH_3$ and $CF_3$; $R^3$ and $R^4$ are selected from the group consisting of $CH_2$ and $CF_2$; x and y show 0 to 4 and m shows 30 to 1000, and a photopolymerization initiator, which is a solid at ambient temperature, melts between 100 and 150° C., has a melt viscosity of not greater than $10^6$ poise and is photocurable.

The present invention is also directed to a fluorine-containing photo-setting resin composition comprising 100 parts by weight of a polymer containing fluorine or a fluorine-containing group represented by general formula [II] (wherein $R^1$ and $R^2$ are selected from the group consisting of H, F, $CH_3$ and $CF_3$; $R^3$ and $R^4$ are selected from the group consisting of $CH_2$ and $CF_2$; x and y show 0 to 4 and m shows 30 to 1000), 0.5 to 100 parts by weight of a polymerizable organic compound and 0.5 to 10 parts by weight of a photopolymerization initiator.

Figure 1:
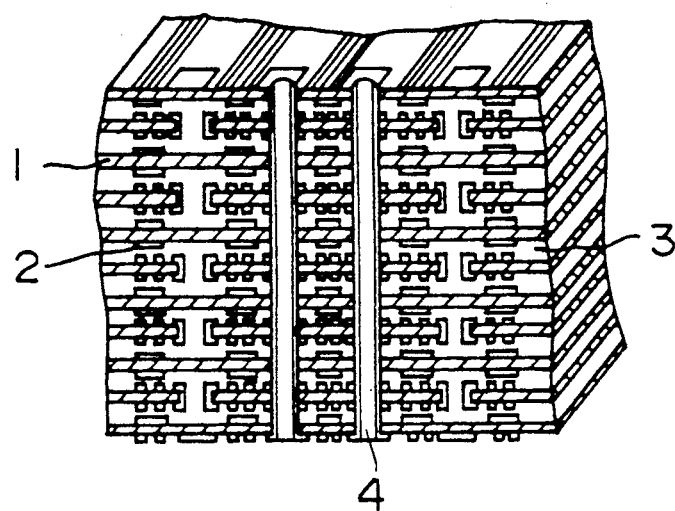
FIG. 1 is a perspective view of the cross section of a multilayer printed wiring board which is an embodiment of the present invention.

Numeral figures indicate:
1 ... substrate
2 ... circuit
3 ... prepreg sheet
4 ... through hole
5 ... dry nitrogen gas
6 ... vacuum pump
7 ... hexafluoro-1,3-butadiene gas
8 ... pressure tube
9 ... pinch cock
10 ... silicone tube
11 ... heat seal
12 ... ampoule tube
(a) ... Example 1
(b) ... Example 17
(c) ... poly(hexafluoro-1,3-butadiene) substrate
(d) ... hexafluoro-1,3-butadiene

DESCRIPTION OF THE PREFERRED EMBODIMENTS

In the present invention, hexafluoro-1,3-butadiene prepolymer is a polymer represented by general formula [I]:

$$R + CF_2 - CF = CF - CF_2 +_n H \qquad [I]$$

(since n is not greater than 4, the prepolymer has at least 4 unsaturated bonds in one molecule; when crosslinked, the cured product having an excellent heat resistance is obtained) which is obtained by anionic polymerization of hexafluoro-1,3-butadiene, and is a powder at room temperature. In addition, the prepolymer is an oligomer having a number average molecular weight of the polymer is about 700 to about 1,000,000.

In terms of viscosity, the prepolymer is as follows.

In order to determine a molecular weight of the hexafluoro-1,3-butadiene prepolymer according to the present invention, dynamic viscosity (centistokes) of the prepolymer polymerized under conditions described below was measured. The results are shown in Table 1. In Run Nos. 1 to 6, the resulting prepolymer was dissolved in a hexafluorobenzene solution and its dynamic viscosity (constant of viscometer × flow time) was determined, wherein the constant of viscometer was 0.006. The viscometer used is a Canon Mining type viscometer manufactured by Shibata Scientific Equipment Industry Co., Ltd. Polymerization in Run Nos. 1 to 3 was performed as in Example 2. Polymerization in Run Nos. 4 to 6 was performed as in Example 1.

t-BuOCs/THF and TOL are abbreviations for tert-butoxy cesium/tetrahydrofuran and toluene, respectively. Hexafluoro-1,3-butadiene : t-BuOCs (weight ratio) is 50:1.

TABLE 1

| No. | Condition for polymerization initiator/solvent | Concentration of prepolymer (g/dl) | Flow time (sec) | Dynamic viscosity (cst) |
|---|---|---|---|---|
| 1 | t-BuOCs/THF | 1.112 | 216.05 | 1.296 |
| 2 | " | 0.741 | 212.04 | 1.272 |
| 3 | " | 0.370 | 209.38 | 1.256 |
| 4 | t-BuOCs/TOL | 1.028 | 226.94 | 1.362 |
| 5 | " | 0.686 | 219.26 | 1.316 |
| 6 | " | 0.343 | 214.15 | 1.285 |

In polymerization using t-BuOCs/THF, the prepolymer of the present invention showed dynamic viscosity of 1.296 to 1.256 centistokes in the prepolymer concentration (g/dl) of 1.112 to 0.370. In polymerization using t-BuOCs/TOL, the prepolymer of the present invention showed dynamic viscosity of 1.362 to 1.285 centistokes in the prepolymer concentration (g/dl) of 1.028 to 0.343.

From the foregoing results, the prepolymer of the present invention has a molecular weight showing 1.25 to 1.50 centistokes in terms of dynamic viscosity, when the prepolymer is dissolved in hexafluorobenzene to form a solution in a concentration of 1 g/dl.

This value is $10^4$ order to $10^5$ order in terms of molecular weight.

The mechanism of 1,4-polymerization of hexafluoro-1,3-butadiene which is a conjugated diene compound is considered as follows.

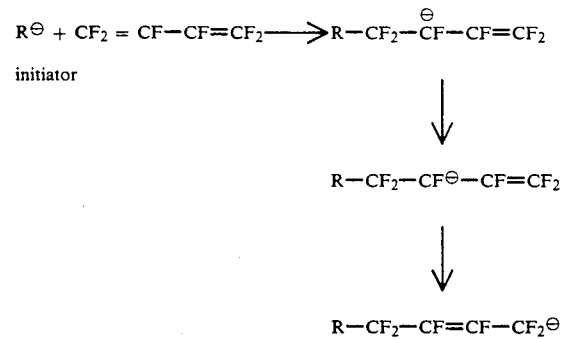

In butadiene, $\pi$ electron conjugation system is present in the whole molecule so that in addition to 1,2 polymerization through ordinary vinyl polymerization, an anion which is the extension terminal moves toward the terminal as shown in the above equation, during which polymerization proceeds. It is considered that also in hexafluoro-1,3-butadiene, 1,4-polymerization would proceed by similar mechanism.

Accordingly, the anionic residue of the initiator binds at the terminal. Because of termination with HCl, the terminal at the opposite side is bound to $H^+$.

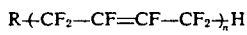

(R: anionic residue of an initiator)

In the case of using, for example, CsF, where R is F and tert-butoxy cesium is used:

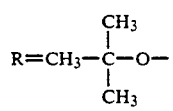

or the like corresponds to R.

The hexafluoro-1,3-butadiene prepolymer can be obtained in a high yield by polymerization of hexafluoro-1,3-butadiene in the presence of a compound containing cesium or a compound having an ionic radius in cation of at least 1.6 angstrom.

Figure 4:
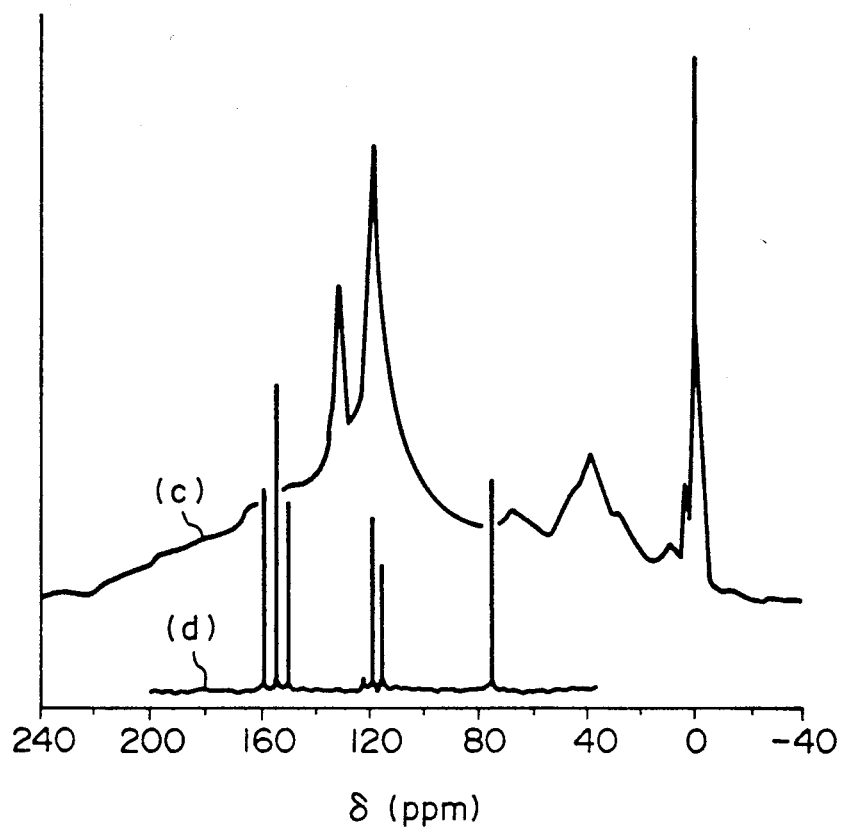
FIG. 4 shows $^{13}C$-NMR spectrum of poly(hexafluoro-1,3-butadiene).

With respect to hexafluoro-1,3-butadiene monomer, the resulting prepolymer and polytetrafluoroethylene, structures of the compounds and chemical shifts were examined by measurement of NMR. As the result, absorptions based on $-CF_2-CF=-CF_2-CF_2-$ were recognized in the prepolymer of the present invention, as shown in FIG. 4. The results of NMR measurement are summarized in Table 2.

TABLE 2

| | Relationship between chemical structure and chemical shift | | | |
|---|---|---|---|---|
| Structure | $\delta \times 10^6$ | Monomer HFBD | Polymer PHFBD | Comparison PTFE |
| *$CF_2=CF-$ | 155 | o | | |
| =*$CF-CF_2-$ | 125–130 | o | o | |
| —*$CF_2-CF=$ | 120 | | o | |
| —*$CF_2-CF_2-$ | 112 | | | o |

As compounds containing cesium, there are cesium fluoride, cesium bromide, cesium chloride, cesium iodide, etc. As alkyl cesiums, there are n-butyl cesium, sec-butyl cesium, tert-butyl cesium, n-propyl cesium, iso-propyl cesium, ethyl cesium, methyl cesium, etc. As cesium alcoholates, there are cesium alkyl alcoholates such as n-butoxy cesium, sec-butoxy cesium, tert-butoxy cesium, n-propoxy cesium, iso-propoxy cesium, ethoxy cesium, methoxy cesium, n-butyl-di-iso-propoxy cesium, di-iso-propyl-iso-propoxy cesium, monoacetyl acetonateiso-propoxy cesium, etc.; and cesium chelate alcoholates, etc.

As cesium salts, there are cesium carbonate, cesium bicarbonate, cesium acetate, cesium sulfate, cesium nitrate, etc.

In addition, there are complexes with the cesium compounds described above, for example, amine complexes such as diisopropylamine-n-butyl cesium, diethylamine/n-butyl cesium, etc.; acetyl acetonate/n-butyl cesium, ethyl cyanoaceate/n-butyl cesium, etc.

The cesium-containing compounds described above which can be used in the present invention may be used alone or in combination. A concentration of the initiator is chosen from a range of 0.01 to 10 mol% based on hexafluoro-1,3-butadiene monomer.

In the present invention, examples of the compound having an ionic radius in cation of at least 1.6 angstrom include metal atoms such as cesium, rubidium, etc.; tertiary amines such as triphenylamine, tri(t-butyl)amine, etc. Among them, cesium ions are particularly preferred as the cation.

As media used in the anion polymerization described above, there are solvents of aromatic hydrocarbon type such as benzene, toluene, xylene, etc.; solvents of hydrocarbon type such as hexane, cyclohexamine, etc.;

solvents of fluorine-containing type such as hexafluorobenzene, etc.; solvents of acetic acid esters such as ethyl acetate, methyl acetate, etc.; solvents of ether type such as diethyl ether, 1,2-dimethoxyethne, tetrahydrofuran, etc. Among them, benzene, toluene and tetrahydrofuran are particularly preferred.

Where the solvent is used, it is necessary that the solvent be thoroughly purified to remove any substance such as oxygen or water dissolved which can be a terminator of the anionic polymerization.

Conditions for the polymerization are chosen from a temperature range higher than room temperature, preferably from a range of 40° to 80° C. and from several days, preferably about 7 days.

In the present invention, the fibrous substrate refers to woven cloth and non-woven cloth using known inorganic and organic fibers such as glass fiber, titanium fiber, aromatic polyamide fiber, polyester fiber, polyamideimide fiber, polyimide fiber, etc. The curable material of the present invention can be provided by the steps of impregnating the hexafluoro-1,3-butadiene prepolymer obtained by the polymerization described above with the fibrous substrate in the solvent system or the non-solvent system and then drying the same.

As the hexafluoro-1,3-butadiene prepolymer used in preparing the curable material described above, it is preferred to use an oligomer having a number average molecular weight of 700 to about 1,000,000, especially several thousands to several tens thousands, from a viewpoint of fluidity upon adhesion of a tacky laminate of the prepreg. When the polymer having an excessively large molecular weight is used, compatibility and reactivity with other polymers may be reduced in some occasion.

In the present invention, the polymerizable compounds are exemplified with compounds containing a reactive double bond(s) such as ethylene, vinyl chloride, vinylidene fluoride, acrylic acid, methacrylic acid, methyl methacrylate, butyl acrylate, styrene, fluorostyrene, α-methylstyrene, allylbenzene, allylphenol, butadiene, isobutylene, isoprene, N-phenylmaleimide, N,N'-substituted unsaturated imides, vinylphenols, vinyl esters, etc., and fluorinated compounds thereof. A ratio of the polymerizable compound formulated is appropriately chosen depending upon purpose of its use and utility. The polymer which is used in the present invention by mixing with the prepolymer refers to known thermosetting polymer and thermoplastic resin. Specific examples of the polymer include epoxy resin, phenol resin, unsaturated polyester resin, melamine resin, urea resin, diallyl phthalate resin, urethane resin, addition reactive polyimide resin, acrylate resin, methacrylate resin, styrene resin, p-hydroxystyrene resin, triazine resin, perfluoroethylene resin, polybutene resin, etc.

Among them, particularly preferred are polybutadiene, phenol resin, addition reactive polyimide resin, p-hydroxystyrene resin and triazine resin, in view of heat resistance and molding processing which are well balanced.

In addition, there may also be used cured polymer obtained by three-dimensionally crosslinking hexafluoro-1,3-butadiene polymer by the assistance of heat or/and optical energy.

The composition comprising the aforesaid polymer and hexafluoro-1,3-butadiene polymer is impregnated with the fibrous substrate in the solvent system or in the non-solvent system and then dried to give the curable material.

Next, a general process for preparing the laminate in the present invention is explained below.

Firstly, the hexafluoro-1,3-butadiene prepolymer or the composition containing the prepolymer is dissolved in an organic solvent to prepare varnish. Examples of the organic solvent include toluene, xylene, acetone, methyl ethyl ketone, N,N-dimethylformamide, N-methylpyrrolidone, dimethylsulfoxide, trichloroethylene, trichloroethane, methylene chloride, dioxan, ethyl acetate, etc. Any solvent may be used so long as it can uniformly dissolve the composition described above. A radical polymerization initiator and various additives are added to the thus prepared varnish to prepare a varnish for impregnation.

Typical examples of the radical polymerization initiator include benzoyl peroxide, dicumyl peroxide, methyl ethyl ketone peroxide, tert-butyl peroxylauate, di-tert-butyl peroxyphthalate, dibenzyloxide, 2,5-dimethyl-2,5-di(tert-butylperoxy)hexane, tert-butylcumyl peroxide, tert-butyl hydroperoxide, di-tert-butyl peroxide, 2,5-dimethyl-2,5-di(tert-butylperoxy)hexane (3), diisopropylbenzene hydroperoxide, p-menthane hydroperoxide, pinane hydroperoxide, 2,5-dimethyl-hexane-2,5-dihydroperoxide, cumene hydroperoxide, etc. These initiators are added in an amount of 0.1 to 10 parts by weight based on 100 parts by weight of the composition. Next, the varnish for impregnation is impregnated with a sheet-like substrate, which is then dried at room temperature to 170° C. to give tackiness-free prepreg. In this case, a temperature for drying is determined depending upon solvent and initiator used. Finally, necessary sheets of the resulting prepreg are laminated with each other and thermal curing reaction is performed at 100° to 250° C. under a pressure of 1 to 100 kgf/cm² to obtain the laminate.

As the sheet-like substrate, there may be used almost all materials conventionally used in laminate materials. As inorganic fibers, there are a variety of glasses such as E glass, C glass, A glass, S glass, D glass and YM-31-A glass which contain $SiO_2$, $Al_2O_3$, etc. as components, and Q glass using quartz, etc. As organic fibers, there are aramid fibers containing as the component a high molecular compound having an aromatic polyamideimide skeleton, etc.

A copper-lined laminate may also be obtained by laminating necessary sheets of the prepreg described above, providing a copper foil on at least one surface and performing thermal curing reaction at 100° to 250° C. under a pressure of 1 to 100 kgf/cm².

Furthermore, a multilayer printing circuit plate (FIG. 1) may be obtained by heating a laminate substrate having a conductive pattern on at least one surface at 100° to 250° C. under a pressure of 1 to 100 kgf/cm² via the prepreg described above to effect curing of the prepreg.

As the various additives which are added to the varnish for impregnation, there are a plasticizing agent, a flame retardant, a treating agent, various inorganic and organic powders such as silica powders, etc.

The hexafluoro-1,3-butadiene prepolymer in the present invention is an oligomer having double bonds on the backbone and having a number average molecular weight of about 700 to about 1,000,000. For this reason, the polymer is characterized in that a range of fluidizing temperature is low at a softening point of 100° C. or lower, as compared to conventional fluorine polymer. In addition, the double bonds on the backbone cause self polymerization between molecules or crosslink with other polymerizable components to form the three-dimensionally crosslinked product having heat resistance, moisture resistance and a low dielectric constant.

Thus, the polymer enables to impregnation with prepreg, mat, chop, etc., which was achieved by conventional thermoplastic tetrafluoroethylene polymer only with difficulty, and provides a novel fluorine curable material.

Furthermore, in the curable material of the present invention, a margin of material fluidity in molding processing such as adhesion of the laminate, etc. can be greatly improved to contribute to improving dimensional stability of the laminate such as a multilayer circuit plate, etc. In addition, the laminate having heat resistance, moisture resistance and a low dielectric constant can be provided.

In the present invention, the fluorocarbon polymer is represented by general formula [II]:

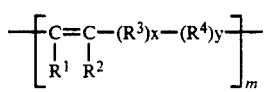

[II]

wherein $R^1$ and $R^2$ are selected from the group consisting of H, F, $CH_3$ and $CF_3$; $R^3$ and $R^4$ are selected from the group consisting of $CH_2$ and $CF_2$; x and y show 0 to 4 and m shows 30 to 1000.

Specific examples include homopolymers such as hexafluoro-1,3-butadiene, 1,1,2-trifluoro-1,3-butadiene, 2-trifluoromethyl-1,3-butadiene, 2-trifluoromethyl-1,3-pentafluorobutadiene, hexafluoro-2-butyne, etc.; and copolymers of at least two of these monomers. A number average molecular weight of the polymer is about 5,000 to about 160,000.

As organic compounds used in the present invention which are polymerizable upon exposure to light or by a polymerization initiator, there are compounds containing polymerizable functional groups such as acryl, methacryl, epoxy, etc., and compounds containing cinnamoyl, cinamylidene, chalcon residue, isocoumarine residue, dimethoxystilbene residue, styrylpyridinium residue, α-phenylmaleimide, etc.

Examples of acrylate compounds are monofunctional compounds such as methyl acrylate, ethyl acrylate, etc.; polyacrylate compounds such as ethylene glycol diacrylate, diethylene glycol diacrylate, glycerine triacrylate, pentaerythritol triacrylate, etc.; polymers containing acryl on the side chain thereof such as poly(vinyl acrylate), poly(4-acryloyloxystyrene), etc. Polyacrylate compounds which function as a crosslinking agent and polymer containing acryl on the side chain thereof are particularly preferred.

As photopolymerization initiators, there are used photoradical initiators of benzophenone type, benzoin type, acetophenone type, thioxanthone type, etc. It is preferred to use the photopolymerization initiator in an amount of 0.5 to 10 parts by weight based on 100 parts by weight of the resin component represented by general formula [II]described above. Where the amount is outside the range, photocuring may be insufficient, it becomes difficult to control a reaction rate, or cracking tends to occur in the cured resin.

The resin composition can form a resin membrane or a film. In particular, varnish can be obtained by dissolving the resin composition in a solvent. The solvent is chosen from those that can dissolve the resin composition. Preferred examples of such a solvent include toluene, xylene, benzene, hexafluorobenzene, acetone, methyl ethyl ketone, N,N-dimethylformamide, N-methylpyrrolidone, dimethyl sulfoxide, trichloroethylene, trichloroethane, dichloromethane, dioxane, ethyl acetate, etc.

As a prepreg substrate, there may be used those of epoxy type, imide type, phenol type, etc. which are generally used for laminate materials. It is also preferred to coat the varnish directly onto a substrate such as glass cloth, organic fiber cloth, unwoven cloth, etc. by means of film adhesion, casting, spin coating, etc., which is then dried and a three-dimensional crosslinking is formed upon exposure of light. As a light source, UV light or visible light is used but in terms of operability, UV light, especially i-rays (436 nm) and g-rays (365 nm) from a high pressure mercury lamp is preferred.

In conventional resin, a resin layer is formed in a prepolymer state and then crosslinked to obtain a three-dimensionally crosslinked resin layer. However, fluorine resin having a low dielectric constant and excellent heat resistance and fire retardance is generally thermoplastic; therefore, it is impossible to form its resin layer by the above conventional method.

The fluorine-containing resin composition of the present invention contains an unsaturated bond so that the composition is soluble in a solvent, the resin layer can be readily formed and the composition can be easily cured upon exposure to light. Furthermore, the composition contains a fluorine atom in the molecule thereof and therefore, the cured product is low in its dielectric constant and shows excellent heat resistance and flame retardance.

EXAMPLE 1

Synthesis of hexafluoro-1,3-butadiene prepolymer

Figure 2:
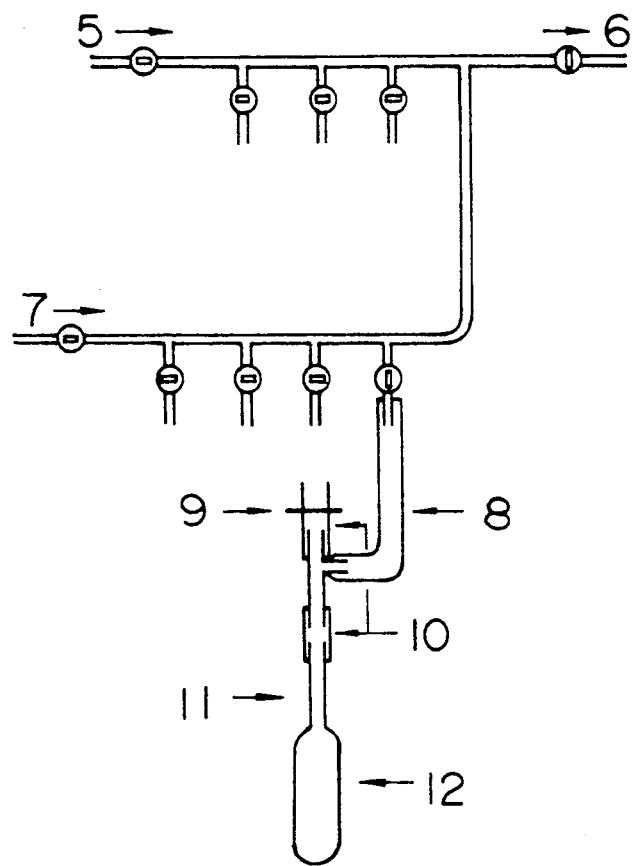
FIG. 2 is a sketchy drawing of a device for anionic polymerization of hexafluoro-1,3-butadiene. Pyrex glass-made vacuum line is so connected that dry nitrogen gas 5 and hexafluoro-1,3-butadiene gas 7 are introduced therein. An ampoule tube 12 is connected with the vacuum line.

While reducing pressure, cesium fluoride (manufactured by Wako Pure Chemical Industry Co., Ltd.) charged in a Pyrex pressure container was heated at 120° to 160° C. on an oil bath followed by drying for 2 hours. Then, 0.12 g (0.79 mmol) of cesium fluoride was charged in an ampoule tube of a 100 ml volume in a glove box, which had been replaced with nitrogen at least 3 times, and connected with a vacuum line as shown in FIG. 2, using a T-shaped tube and a silicone tube.

After the pressure in the vacuum line was reduced, hexafluoro-1,3-butadiene gas purified by molecular sieve and calcium sulfate was introduced into the vacuum line. Hexafluoro-1,3-butadiene which was cooled and liquefied with dry ice and methanol was collected.

Liquid hexafluoro-1,3-butadiene was refluxed in a receiver in the presence of calcium hydride to further purify the same. The receiver in which the liquefied hexafluoro-1,3-butadiene was put was reverted to room temperature and hexafluoro-1,3-butadiene was collected. Three milliliters (39.26 mmols) of hexafluoro-1,3-butadiene was introduced into the ampoule tube which was connected with the vacuum line and in which cesium fluoride described above had been collected.

The ampoule tube was reverted to normal pressure. After the content of the tube was replaced with nitrogen, 20 ml of purified toluene (which was obtained by refluxing toluene of special grade manufactured by Wako Pure Chemical Industry Co., Ltd. for 2 hours in the presence of calcium hydride and then distilling under reduced pressure) stored in nitrogen atmosphere was added with a syringe to thoroughly dissolve the same. The solution was frozen with liquid nitrogen. The pressure of the ampoule tube was again reduced and the ampoule tube was sealed with a burner.

After sealing the tube, the frozen matter was reconstituted and then reacted on an oil bath at 60° C. for 7 days.

Figure 3:
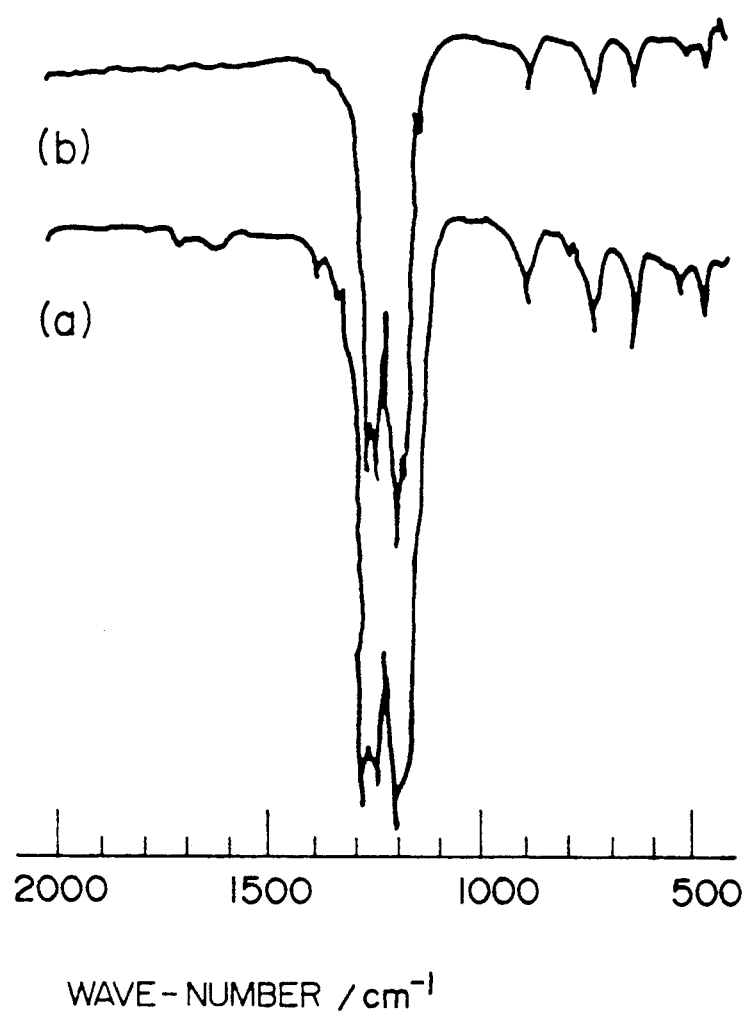
FIG. 3 shows infrared absorption spectrum of the polymerization product of hexafluoro-1,3-butadiene.

Next, the solution in the ampoule tube was again frozen with liquid nitrogen and the ampoule tube was unsealed. Then, 2 to 3 ml of methanolic hydrochloric acid was added to the reaction solution to terminate the reaction. The reaction solution was poured onto about 200 ml of methanolic hydrochloric acid. The formed precipitates were filtered through a glass filter (1G3), washed with methanolic hydrochloric acid, distilled water and methanol and finally dried under reduced pressure by heating at 80° C. until the weight became constant. The yield was 58.9%. The resulting powder sample was examined with respect to its infrared absorption spectrum, using IR-400 spectrometer manufactured by Shimadzu Seisakusho Ltd. The results are shown in FIG. 3(a).

(Preparation of varnish)

In 100.5 parts by weight of dimethylformamide were dissolved 50 parts by weight of 4,4'-bis(diphenylmethane)maleimide, 50 parts by weight of methacrylate and 0.5 part by weight of peroxide as a polymerization initiator to prepare a 50% solution. To the solution was added 70 parts by weight of the hexafluoro-1,3-butadiene polymer obtained in the above process. The mixture was stirred at a constant temperature to disperse the hexafluoro-1,3-butadiene polymer in the solution. Thus, the varnish was prepared.

(Preparation of prepreg and laminate plate)

After the varnish described above was coated by impregnation on glass cloth (manufactured by Nittobo Co., Ltd., T glass cloth: thickness of 60 μm), the cloth was dried at 150° C. for 10 minutes in a thermostat (air) to obtain the prepreg.

Ten sheets of the resulting prepreg were laminated with each other, which was heated with a press machine under pressure of 30 kgf/cm² at a temperature of 130° C. for 30 minutes. By heating at 200° C. under pressure for further an hour, the laminate plate was obtained.

Ten sheets of the resulting prepreg were laminated with each other, on both surfaces of which a copper foil (manufactured by The Furukawa Electric Co., Ltd.; thickness of 70 μm) was further laminated. The laminate was heated with a press machine under pressure under the same conditions as described above to give the copper foil laminate plate.

With respect to the laminate plates prepared by the foregoing process, their properties were evaluated.

Specific dielectric constant

Using LF impedance analyzer 4192A (manufactured by Hewlett-Packard), electrostatic capacity of the sample was determined and its specific dielectric constant was calculated, in accordance with JIS-C-6481.

Peeling strength

Using rheometer NRM-3010D (manufactured by Fudo Industry Co., Ltd.), peeling strength of the copper foil at the vertical direction was measured under conditions of a peeling speed at 50 mm/min., in accordance with JIS-C-6481.

Temperature at which thermal decomposition is initiated

Using high speed differential thermal balance TGD-7000RH (manufactured by Shinku Riko Co., Ltd.), temperature at which thermal decomposition is initiated was determined. As a sample, 10 mg of the resin component ground into powders was used. Weight loss curve on heating at He flow amount of 100 cm²/min and a temperature elevation rate of 5° C./min. was measured and the temperature showing 5% weight loss was made a temperature at which thermal decomposition was initiated.

Thermal expansibility

Using thermal mechanical property-measuring device TM-3000 (manufactured by Shinku Riko Co., Ltd.), a sample piece cut out of the laminate plate in a size of 7 mm×7 mm was measured with respect to thermal expansibility (50° to 220° C.) at the thickness direction of the piece. The measurement was performed under a compressed mode of 10 g load at a temperature elevation rate of 2° C./min.

Flame retardation

Flame retardation was determined by a modification of UL-94 standard.

The results of the measurements are shown in Table 3.

EXAMPLE 2

Hexafluoro-1,3-butadiene prepolymer powder was synthesized under the same conditions as in Example 1 except for using tetrahydrofuran in place of purified toluene used as the solvent in Example 1. Using the hexafluoro-1,3-butadiene prepolymer powder, a varnish was prepared in the same manner as in Example 1.

In dimethylformamide as a solvent were dissolved 30 parts by weight of 4,4'-bis[maleimidophenoxy(phenyl)-]hexafluoropropane, 30 parts by weight of methyl methacrylate and 40 parts by weight of hexafluoro-1,3-butadiene polymer to prepare a 50% solution. Then, the solution was heated at 120° C. for 60 minutes while stirring to perform preliminary reaction. After cooling, 0.5 part by weight of peroxide as a polymerization initiator was added to prepare a varnish.

Using the varnish, the prepreg and laminate plate were prepared in the same manner as in Example 1 and their properties were evaluated. The results are shown in Table 3.

EXAMPLE 3

Using hexafluoro-1,3-butadiene prepolymer powder synthesized in the same manner as in Example 1, a varnish was prepared in the same manner as in Example 1.

After coating by impregnation the varnish on aromatic polyamide fiber woven cloth Kevlar 49 (manufactured by Du Pont), the prepreg and laminate plate were prepared in the same manner as in Example 1 and their properties were evaluated. The results are shown in Table 3.

EXAMPLE 4

After coating by impregnation the varnish prepared in Example 1 on aromatic polyamide fiber non-woven cloth GAU-505-50 (manufactured by Japan Aroma Co., Ltd.), the prepreg and laminate plate were prepared in the same manner as in Example 1 and their properties were evaluated. The results are shown in Table 3.

EXAMPLE 5

Using hexafluoro-1,3-butadiene prepolymer powder synthesized in the same manner as in Example 1, a varnish was prepared in the same manner as in Example 2.

After coating by impregnation the varnish on Kevlar 49 (same as described above), the prepreg and laminate plate were prepared in the same manner as in Example 1 and their properties were evaluated. The results are shown in Table 3.

EXAMPLE 6

After coating by impregnation the varnish prepared in Example 5 on GAU-505-50 (same as described above), the prepreg and laminate plate were prepared in the same manner as in Example 1 and their properties were evaluated. The results are shown in Table 3.

EXAMPLE 7

Hexafluoro-1,3-butadiene prepolymer powder synthesized in the same manner as in Example 1 was subjected to pressure molding under conditions of a pressure of 50 kgf/cm$^2$ at room temperature using a press molding machine to prepare a sheet having a thickness of 100 μm. The results are shown in Table 3.

Then, 5 sheets thus prepared were alternately laminated with 4 prepregs (prepared under the same conditions as in Example 1) composed of 50 parts by weight of amine-added KELIMIDO K607 (manufactured by Rhone Poulanc Co.) in which the impregnation resin component is bismaleimide, 50 parts by weight of methyl methacrylate, 0.5 part by weight of dicumyl peroxide. The laminate was heated in a press at a temperature of 130° C. for 30 minutes under pressure of 30 kgf/cm$^2$ and then cured by heating at 200° C. for further an hour to give a laminate plate. Properties of the laminate plate are shown in Table 3.

EXAMPLE 8

Six sheets of the prepreg prepared in Example 1 were alternately laminated with 5 sheets of the hexafluoro-1,3-butadiene laminate prepared in Example 7 and a laminate plate was prepared under the same conditions as in Example 7. Properties of the laminate plate are shown in Table 3.

EXAMPLE 9

Six sheets of the prepreg prepared in Example 2 were alternately laminated with 5 sheets of the hexafluoro-1,3-butadiene laminate prepared in Example 7 and a laminate plate was prepared under the same conditions as in Example 7. Properties of the laminate plate are shown in Table 3.

Comparative Example 1

Commercially available polytetrafluoroethylene type laminate plate lined with copper

Comparative Example 2

Commercially available glass polyimide type laminate plate lined with copper

Comparative Example 3

Commercially available glass epoxy resin type laminate plate lined with copper.

The results obtained by evaluating properties of the laminate plates in comparative Examples 1 to 3 are shown in Table 3.

TABLE 3

| | Properties of Laminate Plate | | | | |
|---|---|---|---|---|---|
| | | | Property | | |
| Example | Specific dielectric constant (1 MHz) | Copper foil peeling strength (kgf/cm) | Thermal decomposition temperature (°C.) | Thermal expansion coefficient $10^{-5}$ $K^{-1}$ | Flame retardation UL-94 |
| Example 1 | 3.0 | 1.2 | 330 | 8.3 | V-0 |
| Example 2 | 3.0 | 1.4 | 321 | 8.1 | V-0 |
| Example 3 | 2.9 | 1.5 | 319 | 8.2 | V-0 |
| Example 4 | 3.0 | 1.4 | 329 | 8.3 | V-0 |
| Example 5 | 2.8 | 1.3 | 327 | 8.5 | V-0 |
| Example 6 | 2.8 | 1.6 | 331 | 8.5 | V-0 |
| Example 7 | 2.9 | 1.2 | 325 | 8.9 | V-0 |
| Example 8 | 2.7 | 1.7 | 342 | 8.1 | V-0 |
| Example 9 | 2.7 | 1.5 | 329 | 8.2 | V-0 |
| Comparative Example 1 | 2.7 | 1.3 | 450 | 26.0 | V-0 |
| Comparative Example 2 | 3.8 | 1.2 | 340 | 7.5 | V-0 |
| Comparative Example 3 | 4.7 | 1.4 | 320 | 6.5 | V-0 |

From the results shown in Table 3, it is noted that the laminate plate comprising the resin composition of hexafluoro-1,3-butadiene in accordance with the present invention shows thermal expansibility markedly reduced to ⅓ or less than in the commercially available polytetrafluoroethylene type laminate plate (Comparative Example 1). Furthermore, the specific dielectric constant can be greatly reduced as compared to the laminate plate of glass polyimide type (Comparative Example 2) or as compared to the laminate plate of glass epoxy type (Comparative Example 3).

Next, Examples for preparing multilayer wire substrates using the laminate plates (materials) shown in Examples 1 to 9 are given.

EXAMPLE 10

Three sheets of the prepreg prepared in Example 1 were lined with a copper foil (70 μm) on both surfaces. In such a state, the laminate was heated in a press at a temperature of 130° C. for 30 minutes under pressure of 30 kgf/cm$^2$. By heating and curing at 200° C. for further an hour, a copper-lined laminate plate was obtained. A circuit was formed on both surfaces of the copper-lined laminate plate. The laminate plate, on both surfaces of which the circuit was formed, was laminated and adhered via one sheet of the prepreg prepared in Example 1 to prepare a pin grid alley substrate for mounting LSI.

EXAMPLE 11

A microchip carrier substrate for mounting LSI having a six-layer structure was prepared in the same manner as in Example 10. The six-layer structure was composed of two-layered surface layer, two-layered electric source supplying layer and two-layered signal layer.

EXAMPLE 12

Using the prepreg obtained in Example 1, a module substrate for mounting the microchip carrier substrate obtained in Example 11 was prepared in the same manner as in Example 10. The substrate takes a 36-layered structure composed of two-layered surface layer, 10-layered electric source supplying layer, 16-layered signal layer and 8-layered amplifying layer. This substrate can mount 81 pieces (configuration of 9×9) of the microchip carrier substrate obtained in Example 11.

EXAMPLE 13

Using the prepreg obtained in Example 1, a large area substrate for mounting the module substrate for mounting the microchip carrier substrate obtained in Example 12 was prepared in the same manner as in Example 10. The substrate takes a 54-layered structure composed of two-layered surface layer, 20-layered electric source supplying layer, 24-layered signal layer and 8-layered amplifying layer. This substrate can mount 64 pieces (8×8) of the module substrate described above.

EXAMPLE 14

Using the prepreg obtained in Example 6, a large area substrate for mounting the module substrate for mounting the microchip carrier substrate obtained in Example 12 was prepared in the same manner as in Example 10. The substrate takes a 46-layered structure composed of two-layered surface layer, 16-layered electric source supplying layer, 20-layered signal layer and 8-layered amplifying layer. This substrate can mount 36 pieces (configuration of 6×6) of the module substrate described above.

EXAMPLE 15

Polymerization was performed under the same conditions as in Example 1 except for using tetrahydrofuran in place of purified toluene used as the solvent in Example 1. The yield in the polymerization was 71%.

EXAMPLE 16

Polymerization was performed under the same conditions as in Example 1 except for using rubidium fluoride and tetrahydrofuran in place of cesium fluoride as the reaction initiator and purified toluene as the solvent in Example 1, respectively. The yield in the polymerization was 6.1%.

EXAMPLE 17

Polymerization was performed under the same conditions as in Example 1 except for using cesium acetate (manufactured by Wako Pure Chemical Industry Co., Ltd.) and an equimolar mixture of toluene and tetrahydrofuran in place of cesium fluoride as the reaction initiator and purified toluene as the solvent in Example 1, respectively. The yield in the polymerization was 48.8%. Infrared absorption spectrum of the polymer is shown in FIG. 3(b).

EXAMPLE 18

Polymerization was performed under the same conditions as in Example 1 except for using n-butyl cesium and tetrahydrofuran in place of cesium fluoride as the reaction initiator and toluene as the solvent in Example 1, respectively. The yield in the polymerization was 43.2%.

EXAMPLE 19

Polymerization was performed under the same conditions as in Example 1 except for using n-butoxy cesium and tetrahydrofuran in place of cesium fluoride as the reaction initiator and toluene as the solvent in Example 1, respectively. The yield in the polymerization was 80.3%.

TABLE 4

| Reaction Initiator | Solvent | Reaction temperature (°C.) | Reaction Time (H) | Yield (%) |
| --- | --- | --- | --- | --- |
| Example 1 Cesium fluoride | Toluene | 60 | 7 | 58.9 |
| Example 15 Cesium fluoride | THF | 60 | 7 | 71.0 |
| Example 16 Rubidium fluoride | THF | 60 | 7 | 6.1 |
| Example 17 Cesium acetate | Toluene/Xylene | 60 | 7 | 48.8 |
| Example 18 n-Butyl cesium | THF | 60 | 7 | 43.2 |
| Example 19 t-Butoxy cesium | THF | 60 | 7 | 80.3 |
| Comparative Example 4 n-Butyl lithium | THF | 40 | 7 | 0.5 |
| Comparative Example 5 Ethyl magnesium | THF | 0 | 7 | 0.3 |

The curable material using the hexafluoro-1,3-butadiene polymer of the present invention melts and fluidizes at 100° to 170° C. and then three-dimensionally cross-linked to provide the cured molding showing a low dielectric constant, moisture resistance, heat resistance, flame retardation and excellent mechanical properties.

Therefore, multilayer wire circuit substrates having excellent dimensional stability, high density and high reliability can be provided using the curable material.

That is, the present invention can solve the problems in molding processing and dimensional stability which have been problems in conventional thermoplastic fluorine materials, leading to new applications to the laminate of fluorine materials.

EXAMPLE 20

Synthesis of hexafluoro-1,3-butadiene polymer

Synthesis was performed in a nitrogen atmosphere throughout the process. Nitrogen gas introduced into the system was thoroughly dehydrated and purified. Cesium fluoride (manufactured by Wako Pure Chemical Industry Co., Ltd.) was dried at 120° to 160° C. for 2 hours while reducing the pressure. Toluene (special grade manufactured by Wako Pure Chemical Industry Co., Ltd.) was refluxed for 2 hours in the presence of calcium hydride and then distilled under reduced pressure.

In a globe box replaced by nitrogen, 0.12 g (0.79 mmol) of cesium fluoride described above was charged in an ampoule tube of 100 ml, which was connected with vacuum line. Hexafluoro-1,3-butadiene (manufactured by PCR) gas purified by molecular sieves and calcium sulfate was introduced into the line and cooled with dry ice methanol. The liquefied hexafluoro-1,3-butadiene was trapped in the ampoule tube and metered (3 ml, 39.26 mmols). As a solvent, 20 ml of the purified toluene described above was added using a syringe. After thorough dissolution, the solution was frozen with liquid nitrogen. The pressure of the ampoule tube was again reduced and the ampoule tube was sealed with a burner. After sealing the tube, the frozen matter was reacted on an oil bath at 60° C. for 7 days.

After a definite period of time passed, the solution was again frozen with liquid nitrogen and the ampoule tube was unsealed. Then, 2 to 3 ml of methanolic hydrochloric acid was added to the reaction solution to terminate the reaction. The reaction solution was poured onto about 200 ml of methanolic hydrochloric acid. The formed precipitates were filtered through a glass fiber (1G3), washed with methanolic hydrochloric acid, distilled water and methanol and finally dried under reduced pressure by heating at 80° C. until the weight became constant. Powdery hexafluoro-1,3-butadiene polymer was thus obtained. The yield was about 60%.

Figure 5:
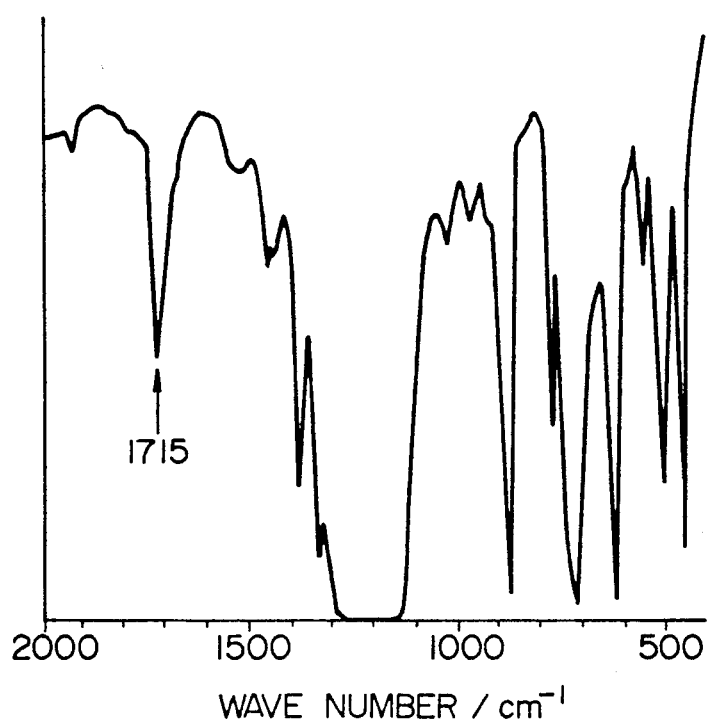
FIG. 5 shows IR spectrum of poly(hexafluoro-1,3-butadiene).

$^{13}$C-NMR spectrum (manufactured by JEOL, Ltd.: GX270) of the polymer described above is shown in FIG. 4. Spectrum (c) shows the polymer and Spectrum (d) shows hexafluoro-1,3-butadiene monomer. The peaks are observed at 120 ppm attributed to —$CF_2$— and at 130 ppm attributed to carbon of —CF=. In FIG. 5, the absorption of the polymer in IR spectrum (Hitachi I-5040) attributed to —CF=CF— is observed at 1715 cm$^{-1}$, from which is judged to be hexafluoro-1,3-butadiene polymer.

Preparation of varnish

A resin composition comprising 100 parts by weight of the poly(hexafluoro-1,3-butadiene) described above, 10 parts by weight of benzophenone (manufactured by Wako Pure Chemical Industry Co., Ltd.) as a photopolymerization initiator and 10 parts by weight of triphenylamine (manufactured by Aldrich) was dissolved in hexafluorobenzene (manufactured by Wako Pure Chemical Industry Co., Ltd.) to prepare a 50 wt. % varnish solution.

Preparation of prepreg and laminate plate

After the varnish described above was uniformly coated onto the surface of glass-polyimide prepreg (manufactured by Hitachi Chemical Co., Ltd., I-67) as a substrate, the varnish-coated substrate was dried at 80° C. for 10 minutes in a thermostat (air). Upon exposure to i-rays (436 nm) from a high pressure mercury lamp, a three-dimensional prepreg type fluorocarbon resin layer was formed on the surface. Ten sheets of the resulting prepreg were laminated with each other, which was heated with a press machine under pressure of 30 kgf/cm$^2$ at a temperature of 130° C. for 30 minutes. By heating at 200° C. under pressure for further an hour, the laminate plate was obtained.

As a sample for determining peeling strength of a copper foil, ten sheets of the prepreg were laminated with each other, on both surfaces of which a copper foil (manufactured by the Furukawa Electric Co., Ltd.; thickness of 70 μm) was further laminated. The laminate was adhered under the same conditions as above.

With respect to the laminate sample described above, its properties were evaluated.

The results of the measurements are shown together in Table 5.

EXAMPLE 21

A resin composition comprising 100 parts by weight of poly(hexafluoro-1,3-butadiene), 10 parts by weight of benzophenone as a photopolymerization initiator and 10 parts by weight of triphenylamine was dissolved in hexafluorobenzene to prepare a 50 wt. % varnish solution. The varnish was coated onto a substrate in a manner similar to Example 20 to prepare prepreg. Using the prepreg, a laminate plate was prepared.

EXAMPLE 22

A resin composition comprising 100 parts by weight of the poly(hexafluoro-1,3-butadiene) described above, 10 parts by weight of poly(4-acryloyloxystyrene) obtained by reacting Resin M manufactured by Maruzen Co., Ltd. at hydroxy of the side chain thereof with acryloyl chloride in equimolar amounts, 10 parts by weight of benzophenone as a photopolymerization initiator and 10 parts by weight of triphenylamine was dissolved in hexafluorobenzene to prepare a 50 wt. % varnish solution. The varnish was coated onto a substrate in a manner similar to Example 20 to prepare prepreg. Using the prepreg, a laminate plate was prepared.

EXAMPLE 23

A resin composition comprising 100 parts by weight of poly(hexafluoro-2-butyne), 10 parts by weight of diethylene glycol diacrylate, 10 parts by weight of benzophenone as a photopolymerization initiator and 10 parts by weight of triphenylamine was dissolved in acetone (manufactured by Wako Pure Chemical Industry Co., Ltd.) to prepare a 50 wt. % varnish solution. The varnish was coated onto a substrate in a manner similar to Example 20 to prepare prepreg. Using the prepreg, a laminate plate was prepared.

EXAMPLE 24

A resin composition comprising 100 parts by weight of poly(1,1,2-trifluoro-1,3-butadiene) described above, 10 parts by weight of benzophenone as a photopolymerization initiator (manufactured by Wako Pure Chemical Industry Co., Ltd.) and 10 parts by weight of triphenylamine as a (manufactured by Aldrich) was dissolved in acetone to prepare a 50 wt. % varnish solution. The varnish was coated onto a substrate in a manner similar to Example 20 to prepare prepreg. Using the prepreg, a laminate plate was prepared.

EXAMPLE 25

A resin composition comprising 100 parts by weight of 1/1 copolymer of hexafluoro-1,3-butadiene/hexafluoro-2-butyne, 10 parts by weight of diethylene glycol diacrylate, 10 parts by weight of benzophenone as a photopolymerization initiator and 10 parts by weight of triphenylamine was dissolved in dimethylformamide (manufactured by Wako Pure Chemical Industry Co., Ltd.) to prepare a 50 wt. % varnish solution. The varnish was coated onto a substrate in a manner similar to Example 20 to prepare prepreg. Using the prepreg, a laminate plate was prepared.

EXAMPLE 26

A varnish prepared in a manner similar to Example 20 was molded into a film by casting. The film was alternately laminated with prepreg I-67 to prepare a 10-layered laminate plate.

EXAMPLE 27

A resin composition comprising 100 parts by weight of poly(hexafluoro-1,3-butadiene), 10 parts by weight of epoxy resin (manufactured by Yuka Shell Co., Ltd. Epicoat 828) and 10 parts by weight of allyldiazonium salt ($CH_3ON_2PF_6$) as a photopolymerization initiator was dissolved in hexafluorobenzene to prepare a 50 wt. % varnish solution. The varnish was coated onto a substrate in a manner similar to Example 20 to prepare prepreg. Using the prepreg, a laminate plate was prepared.

EXAMPLE 28

A resin composition comprising 100 parts by weight of poly(hexafluoro-2-butyne), 10 parts by weight of bismaleimide, 10 parts by weight of benzophenone as a photopolymerization initiator and 10 parts by weight of triphenylamine was dissolved in acetone as a solvent to prepare a 50 wt. % varnish solution. The varnish was coated onto a substrate in a manner similar to Example 20 to prepare prepreg. Using the prepreg, a laminate plate was prepared.

EXAMPLE 29

A prepreg was prepared in a manner similar to Example 1 except that benzoin methyl ether (NISSO CURE MBO, manufactured by Nippon Soda Co., Ltd.) was used instead of the photopolymerization initiator in Example 20. Using the prepreg, a laminate plate was prepared.

EXAMPLE 30

A prepreg was prepared in a manner similar to Example 20 except that 2-hydroxy-2-methyl-1-phenylpropan-1-one (DARO CURE 1173, manufactured by Merck Co., Ltd.) was used instead of the photopolymerization initiator in Example 20. Using the prepreg, a laminate plate was prepared.

EXAMPLE 31

A prepreg was prepared in a manner similar to Example 1 except that 2-methylthioxanthone (NISSO CURE MTX, manufactured by Nippon Soda Co., Ltd.) was used instead of the photopolymerization initiator in Example 20. Using the prepreg, a laminate plate was prepared.

Comparative Example 4

R4737 manufactured by Matsushita Electrics Works, Ltd. which is a polytetrafluoroethylene type laminate plate lined with copper was evaluated with respect to its properties, as in Example 20.

Comparative Example 5

Following the process described in Theses on High Molecular Compound: vol. 47, No. 7, 549–552, a film was prepared by plasma polymerization. There was used a plasma polymerization device using hexafluoroethane (manufactured by Asahi Glass Co., Ltd.) as monomer gas; 13.56 MHz of frequency and 1000 W of output as a high frequency source; an induction binding type coil made of a copper tube having an outer diameter of 6 mm as electrodes; and a quartz tube having an inner diameter of 10 cm and a length of 10 cm as a reaction tube which was horizontally mounted.

Polymerization was carried out for 12 hours under conditions: output of 450 W, pressure of 400 Pa, and 100 cm$^3$/tank of gas flow amount. Thus, a film having a thickness of 40 μm was obtained. Using the thus obtained prepreg, a laminate plate was prepared.

Its properties were evaluated in the same manner as in Example 20.

Comparative Example 6

MCL-I-67 manufactured by Hitachi Chemical Co., Ltd. which is a glass polyimide type laminate plate lined with copper was evaluated with respect to its properties, as in Example 20.

The results obtained in the Examples and Comparative Examples are shown together in Table 5.

TABLE 5

| | Specific Dielectric Constant (1 MHz) | Copper Foil Peeling Strength (kgf/cm) | Temperature When Thermal Decomposition Starts (°C.) | Thermal Expansion Coefficient ($10^{-1}$; $K^{-1}$) | Flame Retardance UL-94 |
|---|---|---|---|---|---|
| Example | | | | | |
| 20 | 2.4 | 1.2 | 350 | 8.3 | V-0 |
| 21 | 2.6 | 1.4 | 331 | 8.1 | V-0 |
| 22 | 2.8 | 1.5 | 315 | 8.2 | V-0 |
| 23 | 2.6 | 1.4 | 319 | 8.3 | V-0 |
| 24 | 2.7 | 1.3 | 317 | 8.5 | V-0 |
| 25 | 2.8 | 1.6 | 321 | 8.5 | V-0 |
| 26 | 2.5 | 1.2 | 345 | 8.9 | V-0 |
| 27 | 2.4 | 1.4 | 325 | 9.1 | V-0 |
| 28 | 3.0 | 1.1 | 332 | 8.8 | V-0 |
| 29 | 2.5 | 1.2 | 355 | 8.3 | V-0 |
| 30 | 2.4 | 1.1 | 345 | 8.3 | V-0 |
| 31 | 2.5 | 1.1 | 350 | 8.2 | V-0 |
| Comparative Example | | | | | |
| 4 | 2.7 | 1.7 | 450 | 26.0 | V-0 |
| 5 | 2.9 | 0.7 | 329 | 13.0 | V-0 |
| 6 | 3.8 | 2.3 | 340 | 7.5 | V-0 |

In the Examples described above, glasspolyimide prepreg (manufactured by Hitachi Chemical Co., Ltd., I-67) was used as a prepreg substrate. Needless to say, however, the photocurable resin composition varnish of the present invention may also be impregnated directly with ordinary glass fiber substrate.

The photocurable resin compositions shown in the Examples can provide the cured products having a low dielectric constant low thermal expansion coefficient which are excellent in heat resistance and flame retardance. Particularly where the cured products are used as prepreg for polyimide laminate materials having low thermal expansion, their specific dielectric constant can be reduced while maintaining their low thermal expansion. The thermal expansion coefficient is approximately ⅓ as compared to that of thermoplastic polytetrafluoroethylene laminate board. Thus, the composition of the present invention can provide a laminate board having excellent dimensional stability.

The photocurable resin composition of the present invention is readily soluble in a solvent and therefore, can be used as various varnish. The composition is also excellent in moldability and provides easy curing due to its photocurability. Particularly where the composition is used in combination with acrylate compounds, glass transition temperature is about 150° and relatively high. Therefore, the composition is suitable as an insulating material which requires mechanical strength at a high temperature.

What is claimed is:

1. A fluorine-containing photo-setting resin composition comprising a polymer containing fluorine represented by general formula:

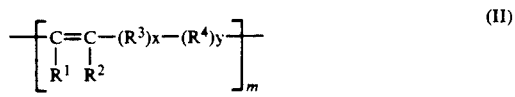

(II)

wherein $R^1$ and $R^2$ are selected from the group consisting of H, F, $CH_3$ and $CF_3$ and at least one of $R^1$ and $R^2$ is F or $CF_3$; $R^3$ and $R^4$ are selected from the group consisting of $CH_2$ and $CF_2$; x and y represent 0 to 1, and m represents 30 to 1000, and a photopolymerization initiator, which is a solid at ambient temperature, melts between 100° and 150° C., has a melt viscosity of not greater than $10^6$ poise and is photocurable.

2. A fluorine-containing photo-setting resin composition comprising 100 parts by weight of a polymer containing fluorine represented by the following general formula:

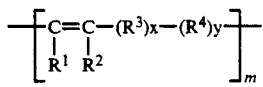
(II)

wherein $R^1$ and $R^2$ are selected from the group consisting of H, F, $CH_3$ and $CF_3$; $R^3$ and $R^4$ are selected from the group consisting of $CH_2$ and $CF_2$; x and y represent 0 to 4 and m represents 30 to 1,000 and 0.5 to 10 parts by weight of a photopolymerization initiator.

3. A fluorine-containing photo-setting resin composition comprising 100 parts by weight of a polymer containing fluorine represented by the following general formula:

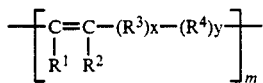
(II)

wherein $R^1$ and $R^2$ are selected from the group consisting of H, F, $CH_3$ and $CF_3$; $R^3$ and $R^4$ are selected from the group consisting of $CH_2$ and $CF_2$; x and y represent 0 to 4 and m represents 30 to 1,000; 0.5 to 100 parts by weight of a polymerizable organic compound and 0.5 to 10 parts by weight of a photopolymerization initiator.

4. A fluorine-containing photo-setting resin composition comprising 100 parts by weight of a polymer containing fluorine represented by the following general formula:

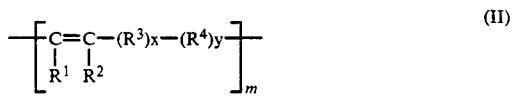
(II)

wherein $R^1$ and $R^2$ are selected from the group consisting of H, F, $CH_3$ and $CF_3$; $R^3$ and $R^4$ are selected from the group consisting of $CH_2$ and $CF_2$; x and y represent 0 to 4 and m represents 30 to 1,000; 0.5 to 100 parts by weight of an acrylate compound monomer and 0.5 to 10 parts by weight of a photopolymerization initiator.

5. A fluorine-containing photo-setting resin composition according to any one of claims 1, 2, 3 and 4, wherein said photopolymerization initiator is selected from the group consisting of a photoradical initiator of benzophenone type, benzoin type, acetophenone and thioxanthone type.

6. A fluorine-containing photo-setting resin composition according to any one of claims 1, 2, 3 and 4, which further comprises 10 to 100 parts by weight of perfluorocarbon resin powders per 100 parts by weight of said resin composition.

7. A varnish composition comprising a fluorine-containing photo-setting resin composition comprising a polymer containing fluorine represented by the following general formula:

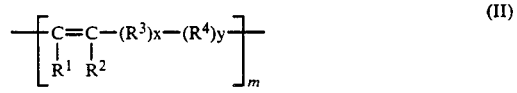
(II)

wherein $R^1$ and $R^2$ are selected from the group consisting of H, F, $CH_3$ and $CF_3$; $R^3$ and $R^4$ are selected from the group consisting of $CH_2$ and $CF_2$; x and y represent 0 to 4 and m represents 30 to 1,000, and a photopolymerization initiator, which is solid at ambient temperature, melts between 100° and 150° C., has a melt viscosity of not greater than $10^6$ poise and is photocurable.

* * * * *